(12) United States Patent
Ratakonda et al.

(10) Patent No.: US 9,331,137 B1
(45) Date of Patent: May 3, 2016

(54) METAL-INSULATOR-METAL CAPACITORS BETWEEN METAL INTERCONNECT LAYERS

(75) Inventors: Deepa Ratakonda, San Jose, CA (US); Peter Smeys, San Jose, CA (US); Shuxian Chen, Fremont, CA (US); Girish Venkitachalam, San Jose, CA (US)

(73) Assignee: Altera Corporation, San Jose, CA (US)

( * ) Notice: Subject to any disclaimer, the term of this patent is extended or adjusted under 35 U.S.C. 154(b) by 159 days.

(21) Appl. No.: 13/431,818

(22) Filed: Mar. 27, 2012

(51) Int. Cl.
*H01L 29/06* (2006.01)
*H01L 49/02* (2006.01)
*H01L 27/108* (2006.01)

(52) U.S. Cl.
CPC .......... *H01L 28/60* (2013.01); *H01L 27/10855* (2013.01)

(58) Field of Classification Search
CPC ................ H01L 28/60; H01L 23/5223; H01L 27/10855; H01L 2924/19041
USPC ............ 361/306.2, 306.3; 257/532, E29.343, 257/E21.011; 438/396
See application file for complete search history.

(56) References Cited

U.S. PATENT DOCUMENTS

| | | | |
|---|---|---|---|
| 5,926,359 A | 7/1999 | Greco et al. | |
| 6,370,012 B1* | 4/2002 | Adae-Amoakoh et al. | 361/306.3 |
| 6,635,527 B1 | 10/2003 | Greco et al. | |
| 6,940,114 B2 | 9/2005 | Oh et al. | |
| 7,339,277 B2* | 3/2008 | Shioga ................ H01L 23/5223 | 257/724 |
| 7,875,956 B2* | 1/2011 | Koutsaroff ........ H01L 23/49822 | 257/295 |
| 2001/0020713 A1 | 9/2001 | Yoshitomi et al. | |
| 2002/0030222 A1* | 3/2002 | Agarwal ....................... 257/310 |
| 2003/0001284 A1* | 1/2003 | List et al. ........................ 257/778 |
| 2004/0061177 A1* | 4/2004 | Merchant et al. ............. 257/349 |
| 2004/0061197 A1* | 4/2004 | Block ................. H01L 23/5223 | 257/532 |
| 2004/0120097 A1* | 6/2004 | Chambers et al. ......... 361/301.2 |
| 2005/0113476 A1* | 5/2005 | Akiyama et al. .................. 522/1 |
| 2006/0138592 A1* | 6/2006 | Block et al. .................... 257/532 |
| 2007/0090546 A1* | 4/2007 | Shioga ................ H01L 21/4846 | 257/790 |
| 2007/0242414 A1* | 10/2007 | Seh et al. .................... 361/306.2 |
| 2008/0054329 A1* | 3/2008 | Kim .................. H01L 21/76816 | 257/306 |
| 2008/0061427 A1* | 3/2008 | Chiang ......................... 257/700 |
| 2008/0064163 A1 | 3/2008 | Coolbaugh et al. | |
| 2009/0026616 A1* | 1/2009 | Dertinger .............. B81B 7/0006 | 257/751 |
| 2009/0073664 A1* | 3/2009 | Winger ......................... 361/734 |
| 2010/0265682 A1* | 10/2010 | Martinez et al. .............. 361/782 |
| 2011/0080686 A1 | 4/2011 | Farcy et al. | |

OTHER PUBLICATIONS

Havemann et al., "High-Performance Interconnects: An Integration Overview," Proceedings of the IEEE, May 2001 (16 pages).

* cited by examiner

*Primary Examiner* — Peter Bradford
(74) *Attorney, Agent, or Firm* — Treyz Law Group, P.C.; Jason Tsai (57) ABSTRACT

An integrated circuit may include interconnects formed from alternating metal interconnect layers and inter-metal dielectric layers. A metal-insulator-metal capacitor may be formed within a selected inter-metal dielectric layer. The metal-insulator-metal capacitor may include first and second capacitor electrodes. The first capacitor electrode may contact a first conductive interconnect line in an underlying metal interconnect layer. The second capacitor electrode may overlap the first capacitor electrode and a portion of a second conductive interconnect line in the underlying metal layer. A via may be formed between the underlying metal interconnect layer and an additional metal interconnect layer. The via may simultaneously contact the second capacitor electrode and the second conductive interconnect line.

18 Claims, 11 Drawing Sheets

METAL-INSULATOR-METAL CAPACITORS BETWEEN METAL INTERCONNECT LAYERS

BACKGROUND

This relates generally to integrated circuits, and more particularly, to integrated circuits with metal-insulator-metal capacitors.

Metal-insulator-metal capacitors are typically formed within a dielectric layer that is interposed between two metal interconnect layers. The metal-insulator-metal capacitors are formed having a bottom capacitor electrode and a top capacitor electrode within the dielectric layer. The bottom capacitor electrode is separated from an adjacent metal interconnect layer by a layer of material such as silicon nitride. The metal-insulator-metal capacitor includes contact terminals that are coupled to the bottom and top capacitor electrodes. The contact terminals are formed in a metal interconnect layer that is adjacent to the dielectric layer (e.g., adjacent to the top capacitor electrode). The metal-insulator-metal capacitor is coupled to other circuitry on the integrated circuit by forming routing paths in the adjacent metal layer between other circuitry and the contact terminals.

Metal-insulator-metal capacitors are sometimes used as decoupling capacitors. Decoupling capacitors are often used to help provide more stable power supply voltages to circuitry on an integrated circuit. Decoupling capacitors shunt high frequency noise on direct current (DC) power supply lines to ground power supply lines, thereby preventing the noise from reaching circuit components on the integrated circuit. In a scenario in which a power supply is required to switch between different modes of operation, a decoupling capacitor having a sufficient capacitance can act as an energy reserve that lessens the magnitude of undesired dips in power supply voltage during mode switching events. Decoupling capacitors formed from metal-insulator-metal capacitors may occupy a disproportionate amount of area on the integrated circuit, because regions of metal layers that are used to form the metal-insulator-metal capacitors may be reserved to form contact terminals for the metal-insulator-metal capacitors.

SUMMARY

An integrated circuit may include interconnects formed from alternating metal interconnect layers and inter-metal dielectric layers. The metal interconnect layers may include conductive interconnect lines. The inter-metal dielectric layers may include conductive vias that connect the metal interconnect layers. The conductive vias and conductive interconnect lines may, for example, form interconnect structures through which signals are routed throughout the integrated circuit. A metal-insulator-metal capacitor may be formed within a selected inter-metal dielectric layer. The metal-insulator-metal capacitor may include first and second capacitor electrodes (e.g., electrodes formed from one or more conductive layers).

The first capacitor electrode may contact a first conductive interconnect line in an underlying metal interconnect layer. The second capacitor electrode may overlap the first capacitor electrode and a portion of a second conductive interconnect line in the underlying metal layer. A via may be formed between the underlying metal interconnect layer and an additional metal interconnect layer. The via may simultaneously contact the second capacitor electrode and the second conductive interconnect line.

The first capacitor electrode may be formed by depositing a first conductive layer over the underlying metal layer and selectively removing portions of the first conductive layer. A capacitor dielectric layer may be subsequently deposited over the first conductive layer. The second capacitor electrode may be formed by depositing a second conductive layer over the capacitor dielectric layer and selectively removing portions of the second conductive layer and the capacitor dielectric layer so that the second capacitor electrode partially overlaps an interconnect line (e.g., an interconnect line in an underlying metal interconnect layer). An etch stop layer and a dielectric material may be deposited over the second capacitor electrode. A via may then be formed by selectively removing a portion of the dielectric material over the interconnect line and depositing conductive material over exposed portions of the top capacitor electrode and the interconnect line.

Further features of the present invention, its nature and various advantages will be more apparent from the accompanying drawings and the following detailed description.

DETAILED DESCRIPTION

Embodiments of the present invention relate to integrated circuits with capacitor circuitry. Integrated circuits include on-chip circuitry that is powered using external power supplies. The external power supplies may be used to supply the integrated circuits with power supply voltages. It is generally desirable to maintain the power supply voltages at constant voltage levels (e.g., to minimize power supply voltage variation).

The amount of power drawn from a power supply may vary during normal operation of an integrated circuit. To accommodate this type of changing power demand while maintaining constant power supply voltage levels, the integrated circuit may include decoupling capacitor circuitry. The decoupling capacitor circuitry may serve as a local energy storage reserve that provides instantaneous current draw. Providing current using the decoupling capacitor circuitry may help reduce power supply noise.

Figure 1:
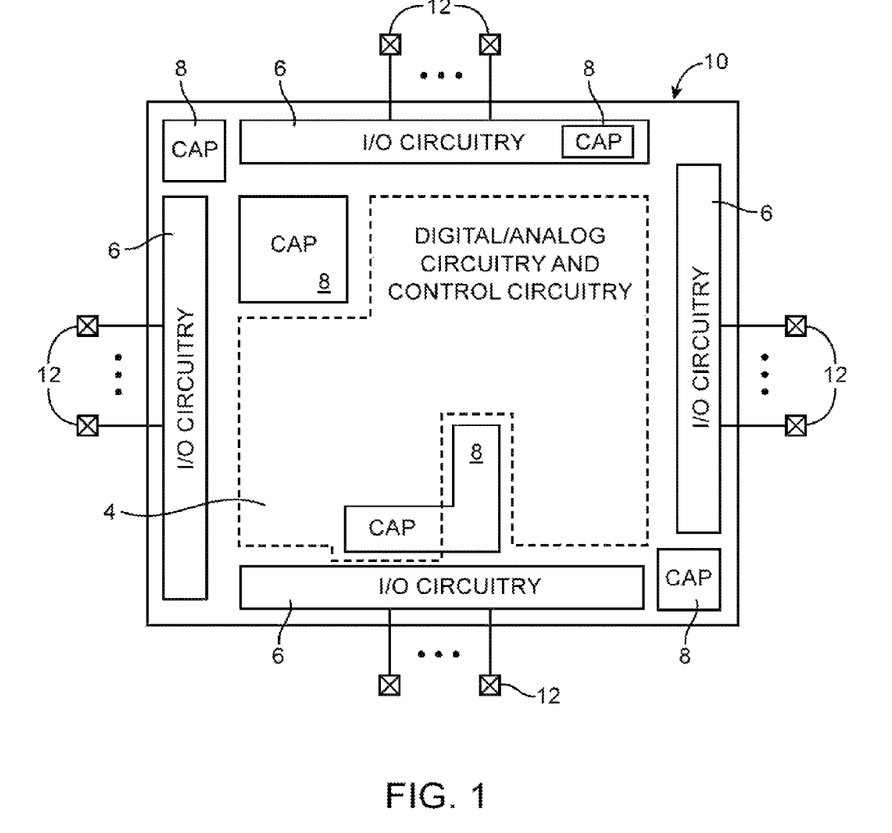
FIG. 1 is a diagram of an illustrative integrated circuit with capacitor circuitry in accordance with an embodiment of the present invention.

FIG. 1 shows an integrated circuit that includes internal circuitry such as digital/analog circuitry and control circuitry 4. Integrated circuit 10 may be formed as a memory chip, a digital signal processing circuit, a microprocessor, an application specific integrated circuit, a programmable integrated circuit, or other desired integrated circuits.

As shown in FIG. 1, integrated circuit 10 may include input-output (I/O) circuitry such as I/O circuitry 6 formed along each edge of integrated circuit 10. Circuitry 6 may be used for driving signals off of device 10 and for receiving signals from other devices via I/O pins 12.

Device 10 may include capacitors 8. Capacitors 8 may be formed in groups. For example, capacitors 8 may be formed as arrays of capacitors. Capacitors 8 may, if desired, be used as decoupling capacitors to help reduce power supply noise. If desired, capacitors 8 may be used to form circuitry such as low-pass filter circuitry, high-pass filter circuitry, or other desired circuitry. For example, capacitors 8 that are formed as part of digital/analog circuitry 4 may be used to form a low-pass filter that reduces the magnitude of low-frequency components of a high-frequency data signal.

Capacitors 8 of varying configurations (e.g., individual capacitors or capacitor arrays of different sizes and shapes) may be formed on device 10. Capacitors 8 may be formed in many locations (e.g. adjacent to I/O circuitry 6, as an integral part of I/O circuitry 6, adjacent to circuits 4 that are sensitive to power supply variation, overlapping with digital/analog circuitry and control circuitry 4, or at any desired location on device 10). Tens or hundreds of capacitors may be formed on device 10, if desired.

Some of capacitors 8 may serve to reduce power supply variation at respective locations on device 10 (e.g., some of capacitors 8 may be decoupling capacitors). As an example, consider a scenario in which an external power source supplies a 1.2 V positive power supply voltage to device 10. Device 10 may include communications circuitry 4 operating at high data rates (e.g., data rates greater than 1 Gbps). During an idle mode, communications circuitry 4 may draw 0.5 A of current from the power source (as an example). During a transmit mode, the communications circuitry may draw 0.7 A of current from the power source. During switching operations from the idle mode to the transmit mode, a decoupling capacitor 8 located adjacent to communications circuitry 4 on device 10 may serve to provide 0.2 A of current (0.7 A-0.5 A) so that communications circuitry 8 receives a constant positive supply voltage of 1.2 V.

Consider another scenario in which the positive power supply experiences an instantaneous voltage glitch. Decoupling capacitors 8 may dampen or absorb this glitch by providing instantaneous current to internal circuitry 4 so that the positive power supply voltage received at the local power supply terminal of circuitry 4 remains constant at 1.2 V (as an example). Decoupling capacitors 8 used to maintain constant power supply voltage while supplying the desired current draw may be referred to as ballasting circuitry.

Integrated circuit 10 may include interconnect layers that are formed above a substrate. The substrate layer may, for example, be formed from silicon or other semiconductor substrate materials, whereas the interconnect layers may include conductive materials such as metals (e.g., copper, aluminum, etc.). The interconnect layers can be used to route signals throughout the integrated circuit. For example, conductive paths may be formed within a given interconnect layer to route signals from a first location to a second location on integrated circuit 10.

The interconnect layers may sometimes be referred to as metal layers or metal interconnect layers, because the conductive paths of the interconnect layers are often formed of metals such as copper or aluminum. Dielectric layers may be interposed between the metal interconnect layers so that signals traversing a given metal interconnect layer are isolated from signals that traverse neighboring interconnect layers (e.g., so that a given interconnect layer is insulated from adjacent interconnect layers). As an example, the dielectric layers may be formed from oxides such as silicon dioxide. The dielectric layers may sometimes be referred to as inter-metal dielectric (IMD) layers.

Figure 2:
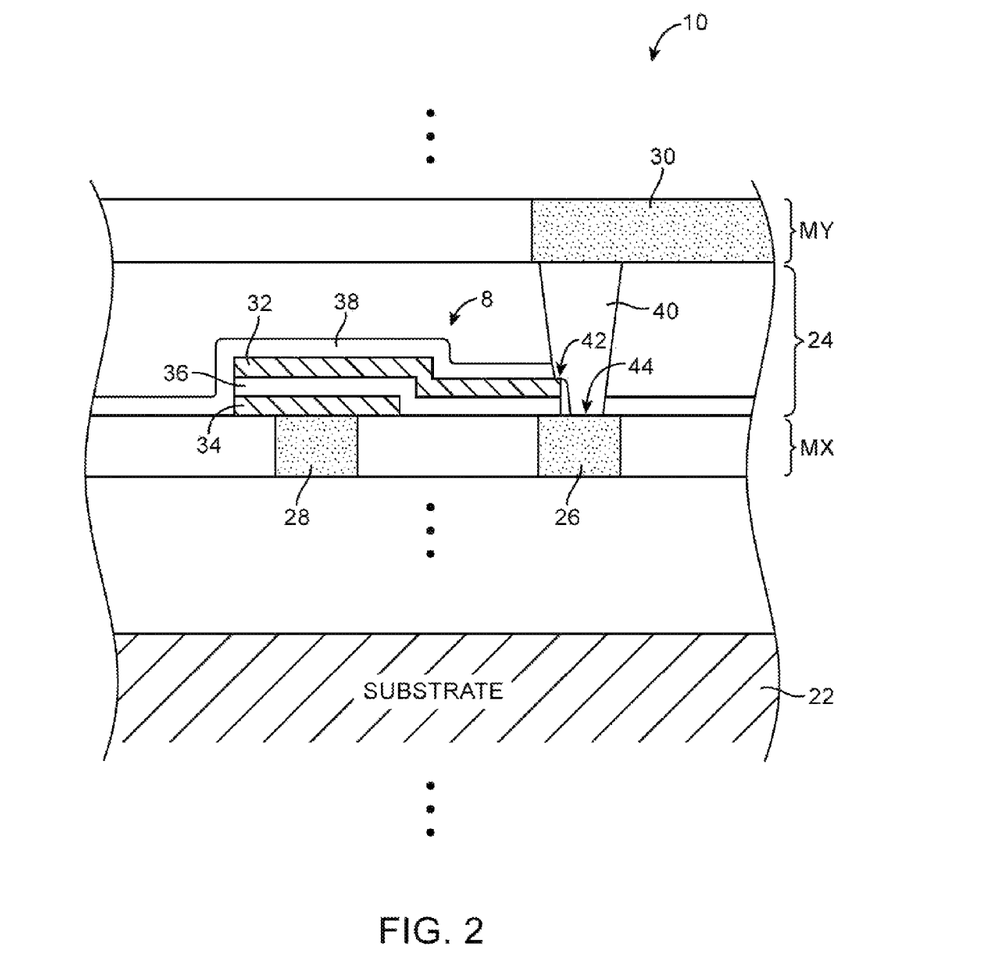
FIG. 2 is a cross-sectional side view of an illustrative metal-insulator-metal capacitor in accordance with an embodiment of the present invention.

Capacitors 8 may be formed using the inter-metal dielectric layers. For example, a capacitor 8 may be formed as a parallel plate capacitor within an inter-metal dielectric layer that is interposed between two adjacent metal layers. Capacitors that are formed as parallel plate capacitors within the inter-metal dielectric layers are sometimes referred to as metal-insulator-metal (MIM) capacitors. FIG. 2 is an illustrative cross-sectional diagram of a metal-insulator-metal capacitor formed using an inter-metal dielectric layer of device 10.

As shown in FIG. 2, device 10 may include a substrate 22 over which metal interconnect layers MX and MY are formed. Circuitry such as metal-oxide-semiconductor (MOS) transistors or other circuit components may be formed within the substrate. Layers MX and MY may include conductive interconnect paths (e.g., conductive interconnect lines) such as conductive paths 26, 28, and 30 that can be used to route signals between circuitry of device 10. Conductive paths 26, 28, and 30 may be formed in any desired direction within a corresponding metal layer. For example, paths 28 and 26 may be formed within metal layer MX along an axis into and out of the page, whereas path 30 of metal layer MY may extend beyond the right side of the page.

Dielectric layers (e.g., inter-metal dielectric layers) may be interposed between each pair of metal layers so that the metal layers are electrically isolated from each other. The dielectric layers may help prevent signals that traverse conductive paths of a given metal layer from reaching other metal layers. For example, dielectric layer IX may help isolate signals that traverse conductive path 28 of metal layer MX from signals on conductive path 30 of metal layer MY.

Metal-insulator-metal capacitor 8 may be formed within inter-metal dielectric layer IX. Metal-insulator-metal capacitor 8 may include a bottom capacitor electrode 34 formed from a first conductive layer, a dielectric layer 36, and a top capacitor electrode 32 formed from a second conductive layer. Capacitor electrodes 32 and 34 may effectively form a parallel plate capacitor with dielectric layer 36 separating layers 32 and 34. The capacitance of capacitor 8 may be proportional to the overlapping area of capacitor electrodes 32 and 34 (e.g., the capacitance of capacitor 8 may be increased by increasing the overlapping area of capacitor electrodes 32 and 34). The capacitance of capacitor 8 may be inversely proportional to the thickness of dielectric layer 36 and may also be dependent on the dielectric constant of the material used to form dielectric layer 36.

Bottom capacitor electrode 34 of capacitor 8 may be formed directly above and contacting path 28 of metal layer MX. Top capacitor electrode 32 may be formed to cover bottom capacitor electrode 34 and also cover a portion of conductive path 26. Via 40 may be formed through inter-metal dielectric layer IX between metal layers MX and MY so that region 42 of top conductive layer 32 and region 44 of path 26 are electrically coupled together. Via 40 may be formed having any desired shape (e.g., by selectively removing portions of inter-metal dielectric layer IX to form a desired shape). Via 40 may electrically couple top capacitor 32, path 26 of layer MX, and path 30 of layer MY. For example, via 40 may be formed using conductive materials such as copper, aluminum, etc. Path 30 of metal layer MY may be used to couple via 40 (and top capacitor electrode 32) to other circuitry on device 10.

By forming metal-insulator-metal capacitor 8 so that bottom capacitor electrode 34 directly contacts conductive path 28 and top capacitor electrode 32 is electrically coupled to path 26, available area of metal layers MY and MX may be conserved. For example, the region of metal layer MY above capacitor 8 may be used to form conductive paths for routing signals. As another example, metal-insulator-metal capacitor 8 may be formed between existing conductive paths of a given integrated circuit layout.

Consider the scenario in which path 26 is a power supply path through which a positive power supply voltage is routed to circuitry throughout device 10 and path 28 is a power supply ground path. In this scenario, metal-insulator-metal capacitor 8 may be formed as a decoupling capacitor between the power supply path and the power supply ground path without altering the existing circuit layout (e.g., without forming separate contact terminals for top capacitor electrode 32 and bottom capacitor electrode 34 or forming additional routing paths in metal layers MX and MY).

The example of FIG. 2 in which capacitor 8 is formed within inter-metal dielectric layer IX is merely illustrative. If desired, device 10 may be formed with any number of metal layers (e.g., 2, 4, 6, or more) and inter-metal dielectric layers (e.g., a dielectric layer may be formed between each pair of conductive layers). As an example, additional metal and dielectric layers may be formed above and/or below metal layers MX and MY. Metal-insulator-metal capacitors 8 may be formed within one or more desired insulating layers.

Figure 3:
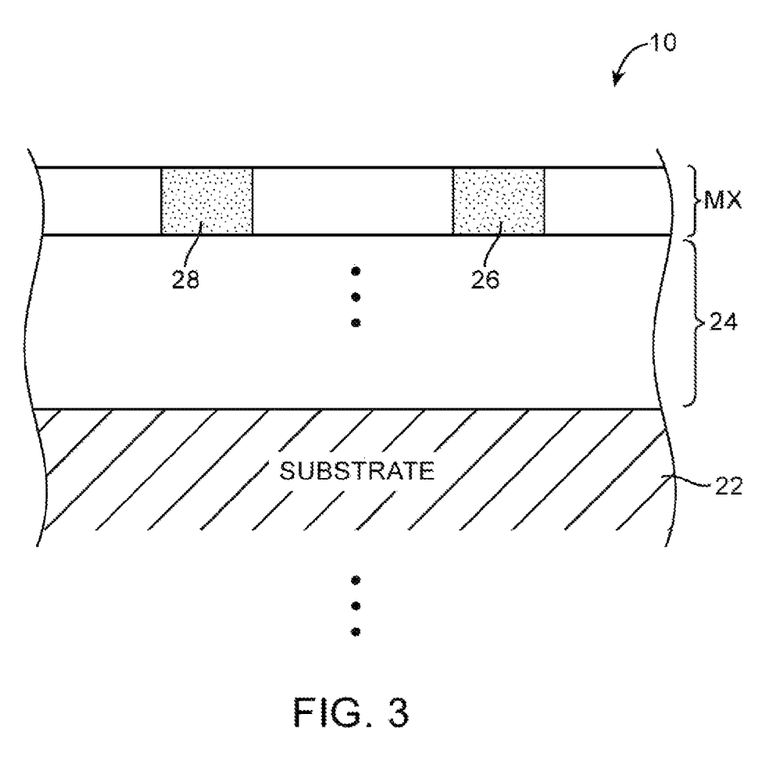
FIGS. 3-11 are cross-sectional side views showing illustrative steps involved in forming the metal-insulator-metal capacitor of FIG. 2 in accordance with an embodiment of the present invention.

FIGS. 3-11 show illustrative steps involved in forming a metal-insulator-metal capacitor 8 coupled between conductive paths of a given metal layer. As shown in FIG. 3, device 10 may be formed with conductive paths 26 and 28 in a first metal layer MX. Paths 26 and 28, may, for example, be used as signal routing paths for routing data signals or power supply signals throughout device 10 (or throughout regions of device 10). Metal layer MX may be formed above region 24 and substrate 22 (e.g., a region including zero or more additional metal layers or insulating layers). As an example, circuitry such as transistors may be formed within substrate 22. In this scenario, the circuitry may be coupled to paths 26 and 28 via additional signal routing paths formed from layers of region 24.

Figure 4:
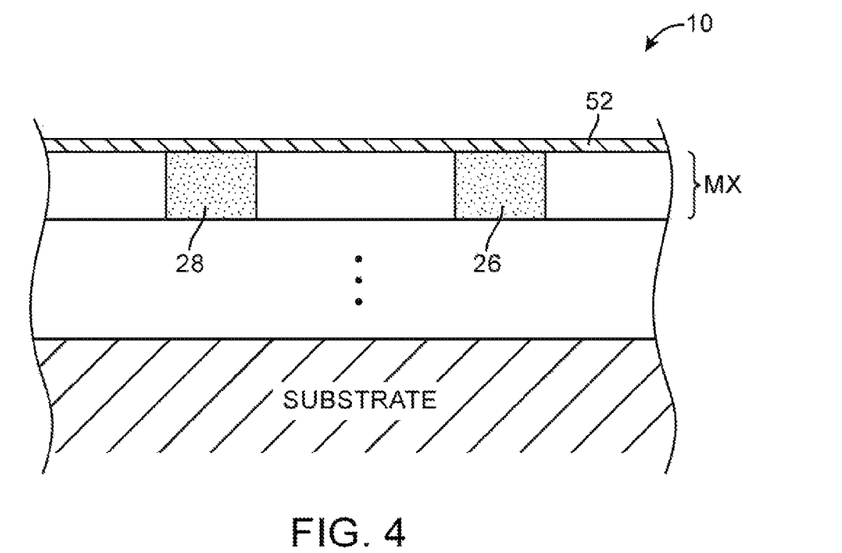

As shown in FIG. 4, a conductive layer 52 may be formed over metal layer MX. Conductive layer 52 may be formed by depositing a conductive material such as tantalum nitride, titanium nitride, tungsten nitride, or other conductive materials over metal layer MX. Conductive layer 52 may be deposited using deposition techniques such as atomic layer deposition (ALD), molecular beam epitaxy (MBE), electrochemical deposition (ECD), chemical vapor deposition (CVD), physical vapor deposition (PVD), or other desired types of coating techniques. Conductive layer 52 may be formed having any desired thickness. For example, layer 52 may be formed of a layer of tantalum nitride with a thickness of about 200 angstroms to 400 angstroms.

Figure 5:
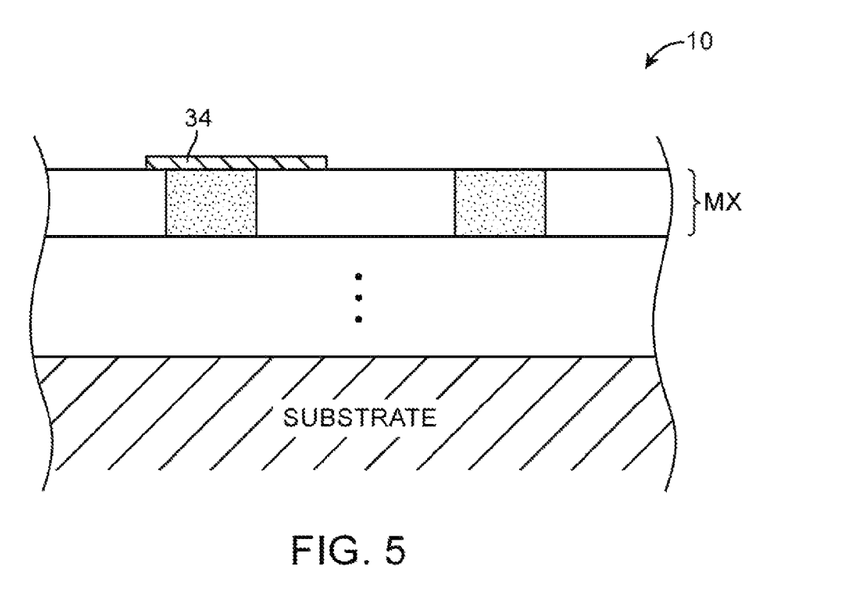

As shown in FIG. 5, bottom capacitor electrode 34 may be formed by selectively removing portions of conductive layer 52. For example, a photoresist mask may be applied to conductive layer 52 and an etching process may be subsequently performed to selectively remove portions of layer 52 (e.g., portions of layer 52 that are not covered by the photoresist mask). As an example, an anisotropic plasma etching process may be used (e.g., using plasma etchants such as sulfur hexafluoride, nitrogen trifluoride, dichlorodifluoromethane, etc.) to selectively etch into conductive layer 52. As another example, an anisotropic wet etching process may be used (e.g., using wet etchants such as nitric acid, hydrofluoric acid, or other acids) to selectively form bottom capacitor electrode 34. The photoresist mask may be subsequently removed using processes such as plasma ashing.

Figure 6:
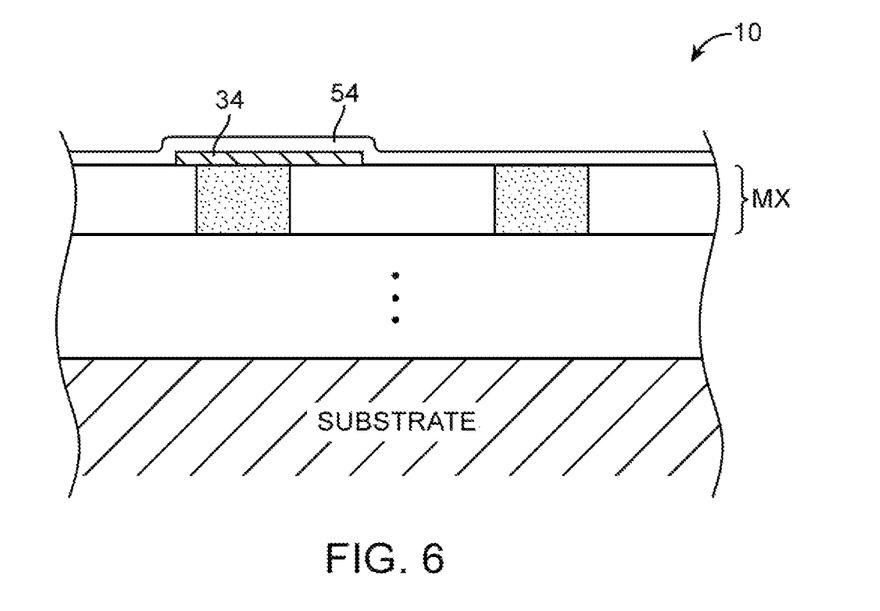

A dielectric layer 54 may be subsequently deposited over bottom capacitor electrode 34 and metal layer MX as shown in FIG. 6. Dielectric layer 54 may be deposited using any desired deposition technique. Layer 54 may be formed from any suitable dielectric material such as undoped silicon glass (e.g., silicon dioxide) or other oxides. Layer 54 be formed having any desired thickness such as about 200 angstroms (as an example). The thickness of dielectric layer 54 may be reduced to increase the capacitance of capacitor 8 that is formed by the steps of FIGS. 3-11.

If desired, dielectric layer 54 may be formed of materials such as high-κ dielectric materials (e.g., chromium oxide, hafnium oxide, hafnium silicate, zirconium silicate, zirconium oxide, etc.). As an example, a layer of silicon dioxide may exhibit a dielectric constant κ of 3.9, whereas a layer of hafnium oxide may exhibit a relatively high dielectric constant κ of 25. The use of high-κ material in dielectric layer 54 may provide increased capacitance for a given thickness of dielectric layer 54.

Figure 7:
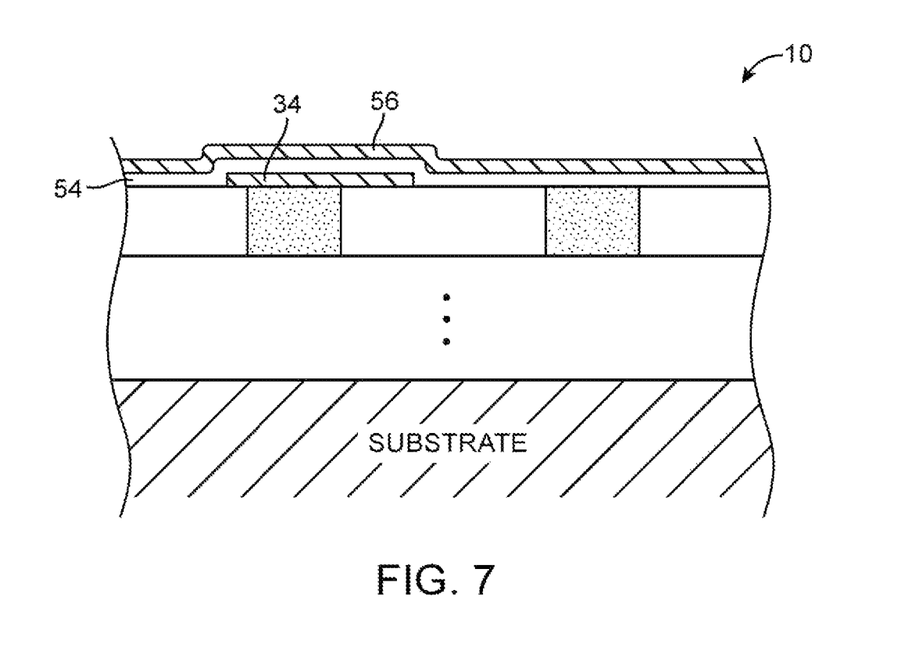

As shown in FIG. 7, a conductive layer 56 may be deposited over dielectric layer 54. Conductive layer 56 may be formed using deposition techniques substantially similar to layer 52 of FIG. 4. For example, a layer of tantalum nitride or other conductive material may be deposited over dielectric layer 54 using atomic layer deposition to form conductive layer 56. Conductive layer 56 may be formed of any desired thickness such as about 500 angstroms.

Figure 8:
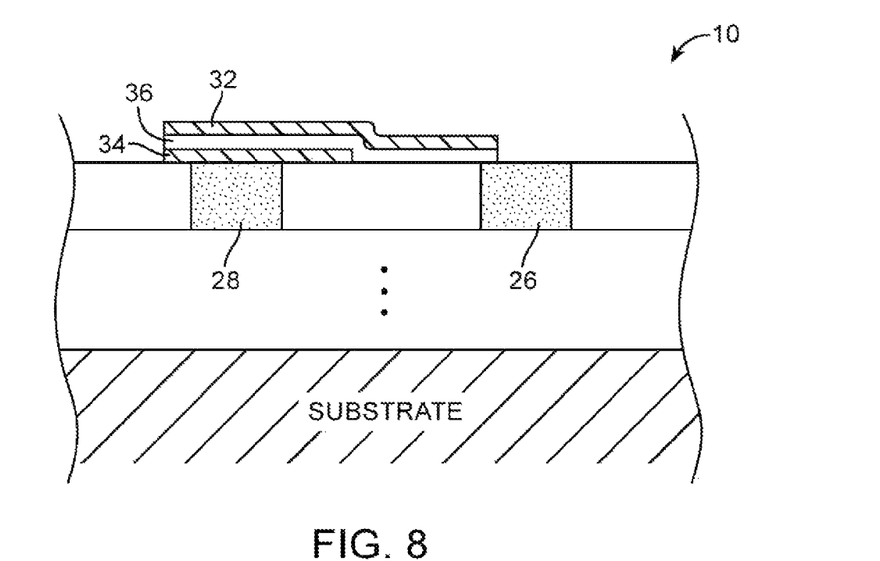

In a subsequent step after depositing conductive layer 56, top capacitor electrode 32 and capacitor dielectric layer 36 may be formed by selectively removing portions of conductive layer 56 and dielectric layer 54. As shown in FIG. 8, top capacitor electrode 32 and capacitor dielectric layer 36 may be formed to overlap with conductive path 26 and bottom capacitor electrode 34. Top capacitor electrode 32 and capacitor dielectric layer 36 may be formed from conductive layer 56 and dielectric layer 54 by applying a photoresist mask over conductive layer 56 and subsequently performing an etching process to selectively remove portions of conductive layer 56 and underlying dielectric layer 36.

Figure 9:
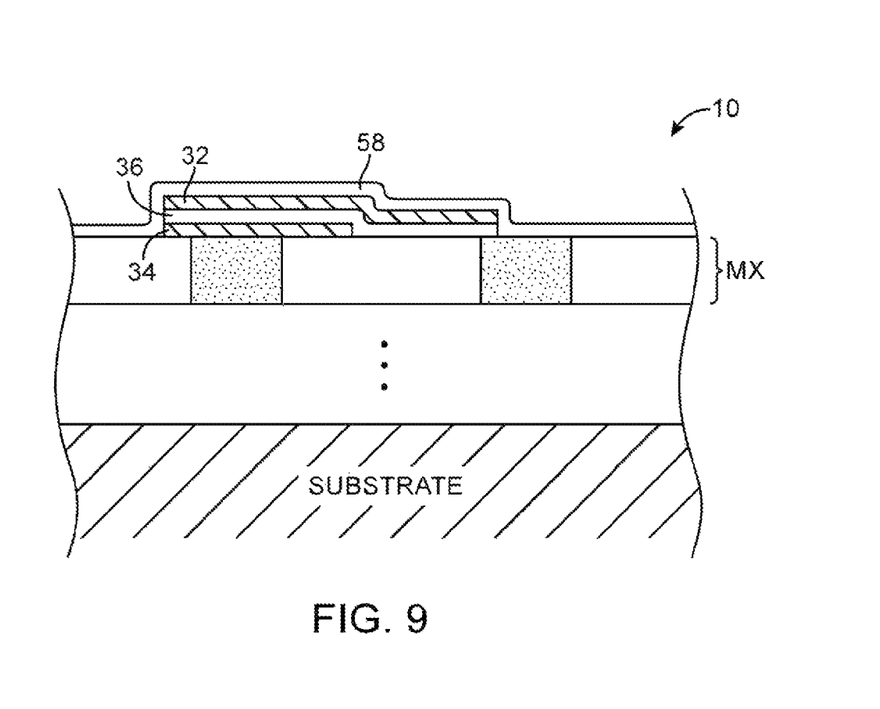

After forming top capacitor electrode 32 and capacitor dielectric layer 36, an etch stop layer 58 may be deposited over top capacitor electrode 32 and metal layer MX as shown in FIG. 9. Etch stop layer 58 may be formed from a material that is resistant to etching such as nitrides (e.g., silicon nitride, titanium nitride, etc.).

Figure 10:
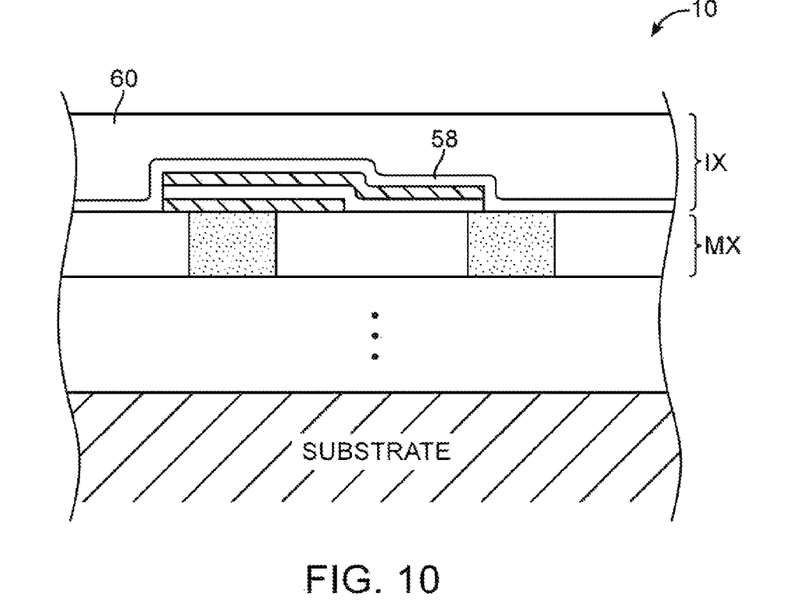

As shown in FIG. 10, inter-metal dielectric layer IX may be subsequently formed. Inter-metal dielectric layer IX may be filled with a dielectric material 60 such as an oxide material (e.g., silicon dioxide). Dielectric material 60 may be deposited over etch stop layer 58 using any desired deposition technique (e.g., chemical vapor deposition or other deposition techniques). Planarization techniques such as chemical-mechanical planarization (CMP) may then be applied to remove any excessive dielectric material protruding beyond the upper surface of dielectric layer IX.

Figure 11:
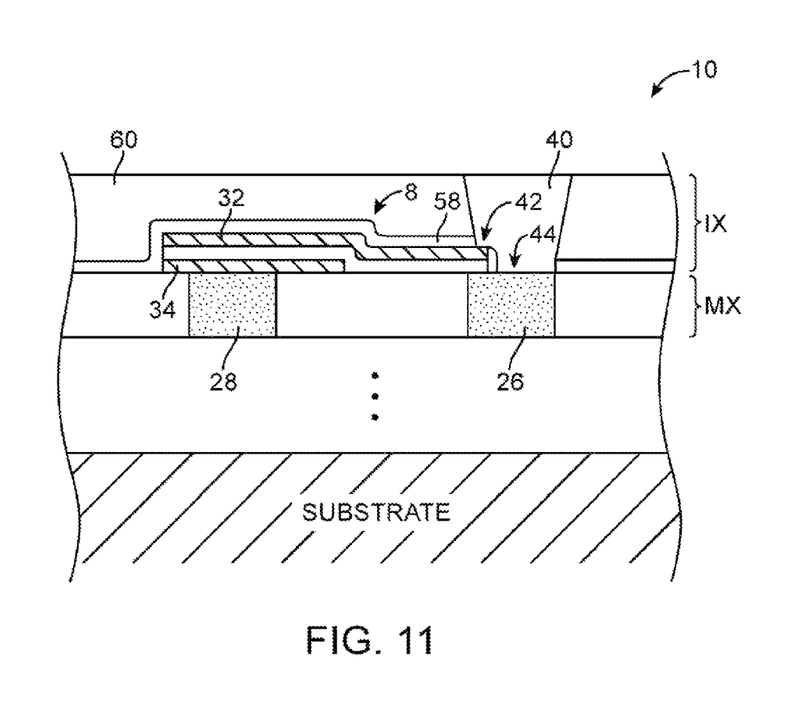

As shown in FIG. 11, a via 40 may then be formed that electrically couples top capacitor electrode 32 to conductive path 26. Via 40 may be formed by applying a photoresist mask over dielectric layer 60 and performing an etching process to selectively remove a portion of inter-metal dielectric layer IX located above conductive path 26. Etch stop layer 58 may be resistant to the etching process and may help isolate top capacitor electrode 32 and conductive path 26 from the etching process.

Portions of etch stop layer 58 that cover top capacitor electrode 32 and conductive path 26 may be removed during the etching process or during a subsequent etch stop removal process (e.g., an etching process that removes materials such as nitrides or other etch stop layer materials). In particular, portions of etch stop layer 58 over regions 42 and 44 may be removed to expose underlying portions of top capacitor electrode 32 and conductive path 26. Via 40 may be subsequently filled with a conductive material such as copper, aluminum, or other conductive materials. If desired, multiple layers of different conductive materials may be used to fill vias 40. The conductive material may directly contact regions 42 and 44 so that top capacitor electrode 32 is electrically coupled to conductive path 26 (e.g., so that regions 42 and 44 are electrically shorted together).

The example of FIG. 11 in which regions 42 and 44 are exposed during the etching process is merely illustrative. If desired, portions of etch stop layer 58 that cover regions 42 and 44 may remain after the etching process (e.g., a residual layer of etch stop layer 58 may remain). For example, etch stop layer 58 may be formed of a conductive material such as titanium nitride that is resistant to the etchant used to etch dielectric layer 60. In this scenario, etch stop layer 58 may form part of top capacitor electrode 32 and may isolate top capacitor electrode 32 and conductive path 26 from the etchant while allowing top capacitor electrode 32 to contact via 40 and conductive path 26.

Via 40 and conductive path 26 may collectively form a first capacitor terminal that is coupled to top capacitor electrode 32. Conductive path 28 may form a second capacitor terminal that is coupled to bottom capacitor electrode 34.

If desired, additional layers may be formed above dielectric layer IX. For example, an additional metal layer MY such as shown in FIG. 2 may be formed above dielectric layer IX. In this scenario, metal layer MY may include conductive paths such as path 30 that contact via 40. The additional layers may be formed using any suitable deposition techniques.

Figure 12:
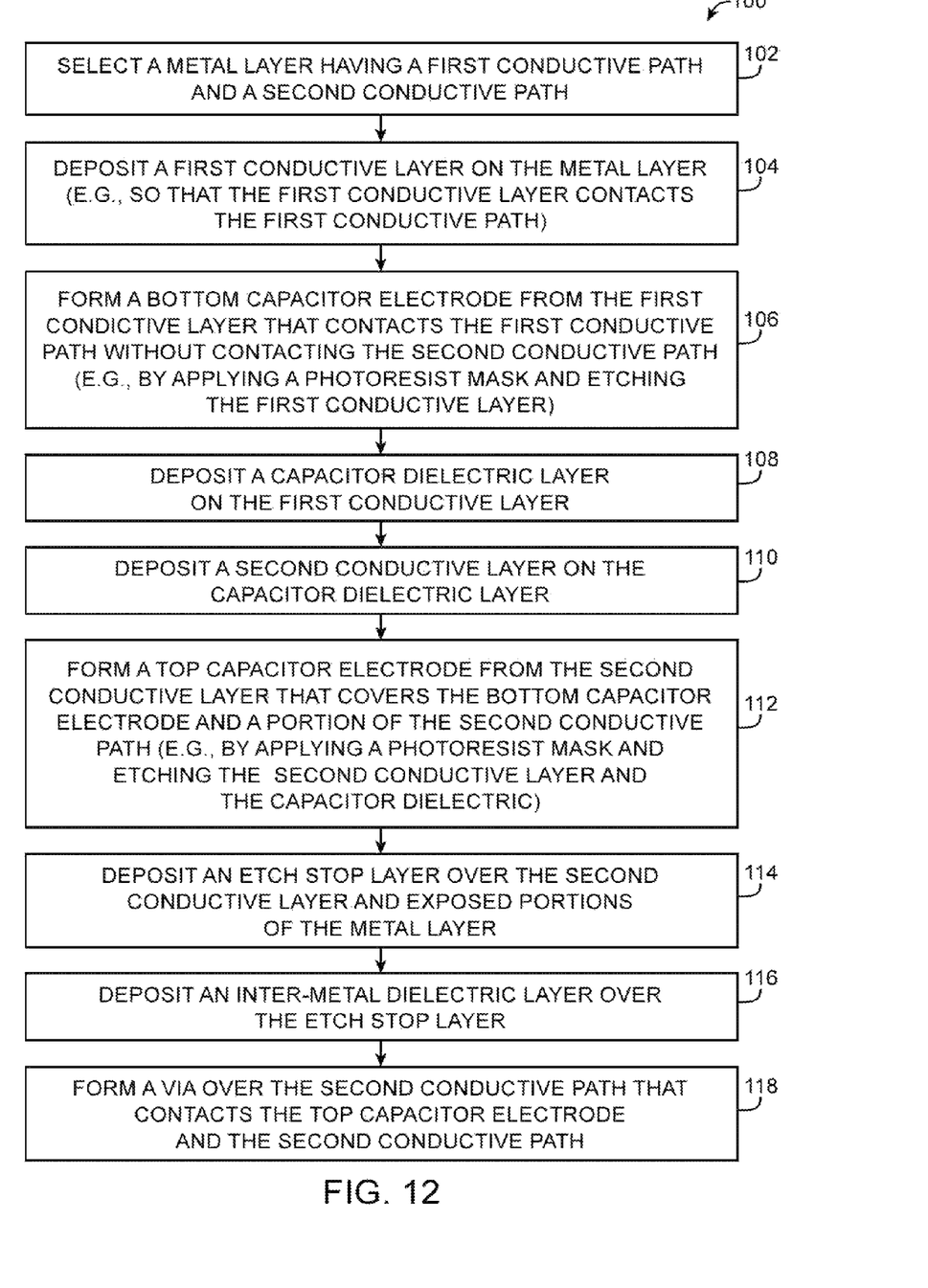
FIG. 12 is a flow chart of illustrative steps involved in forming a metal-insulator-metal capacitor in accordance with an embodiment of the present invention.

FIG. 12 is a flowchart 100 of illustrative steps that may be performed to form a metal-insulator capacitor on an integrated circuit (e.g., as described in connection with FIGS. 3-11).

In step 102, a metal layer having a first conductive path and a second conductive path may be selected (e.g., metal layer MX that has a first conductive path 26 and a second conductive path 28). The first and second conductive paths may have been formed as a part of circuitry on the integrated circuit. For example, the first conductive path may have been formed as a power supply path or a data signal path and the second conductive path may have been formed as a ground supply path.

In step 104, a first conductive layer may be directly deposited on the selected metal layer. The first conductive layer may be deposited to contact the first conductive path. Depositing tools may be used to deposit the first conductive layer on the selected metal layer. As an example, conductive layer 52 of FIG. 4 may be deposited over metal layer MX using atomic layer deposition tools.

In step 106, fabrication tools such as photolithography tools may be used to form a bottom capacitor electrode from the first conductive layer (e.g., bottom capacitor electrode 34 as shown in FIG. 5). The bottom capacitor electrode may be formed to contact the first conductive path without contacting the second conductive path. As an example, photolithography tools may be used to apply a photoresist mask that selectively identifies regions of the first conductive layer that should be removed. In this scenario, etching tools may be used to selectively remove the identified regions of the first conductive layer so that the bottom capacitor electrode only contacts the first conductive path.

In step 108, depositing tools may be used to deposit a dielectric layer over the first conductive layer (e.g., as shown in FIG. 6, dielectric layer 54 may be deposited over the first conductive layer and exposed regions of metal layer MX). The dielectric layer may form a capacitor dielectric layer of the metal-insulator-metal capacitor.

In step 110, depositing tools may be used to deposit a second conductive layer over the capacitor dielectric layer. For example, conductive layer 56 may be formed over dielectric layer 54 as shown in FIG. 7.

In step 112, photolithography tools may be used to form a top capacitor electrode by selectively removing portions of the second conductive layer and the underlying capacitor dielectric layer. For example, the photolithography tools may be used to apply a photoresist mask and subsequently perform an etching process to form top capacitor electrode 32 as shown in FIG. 8.

In step 114, depositing tools may be used to deposit an etch stop layer over the second conductive layer and regions of the metal layer that have been exposed by the operations of step 112 (e.g., portions of the metal layer that have been exposed by an etching process). As an example, etch stop layer 58 may be formed as shown in FIG. 9.

In step 116, an inter-metal dielectric layer may be formed by depositing a layer of dielectric material over the etch stop layer. If desired, polishing tools may be used to ensure that the inter-metal dielectric layer forms a planar layer (e.g., by polishing the surface of the inter-metal dielectric layer to remove irregularities). As an example, dielectric layer 60 may be deposited to form inter-metal dielectric layer IX as shown in FIG. 10.

In step 118, a via may be formed over the second conductive path. The via may directly contact the top capacitor electrode and the second conductive path, thereby providing an electrical path between the top capacitor electrode and the second conductive path. As an example, via 40 of FIG. 11 may be formed that contacts region 42 of top capacitor electrode 32 and region 44 of conductive path 26.

Figure 13:
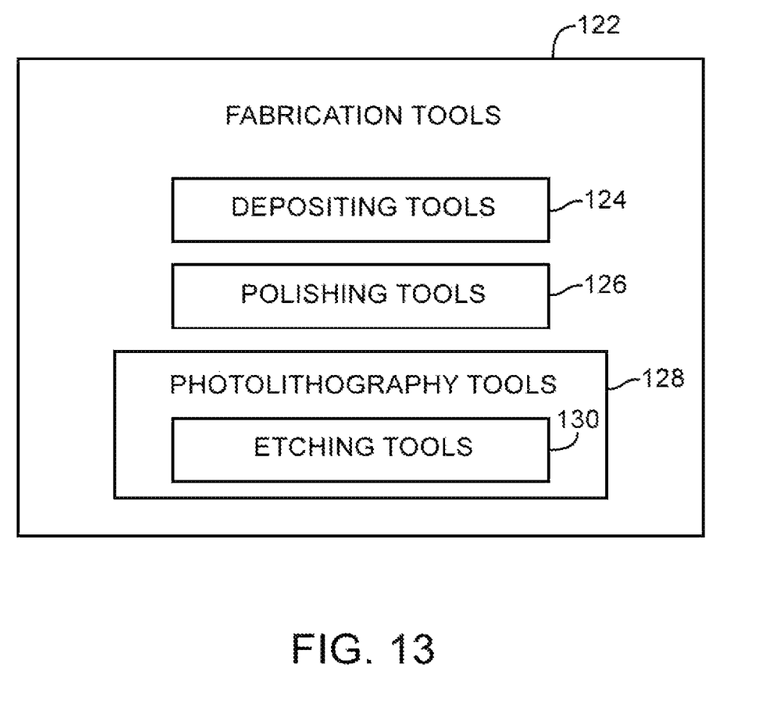
FIG. 13 is a diagram of illustrative fabrication tools that may be used to form a metal-insulator-metal capacitor in accordance with an embodiment of the present invention.

FIG. 13 is a diagram of fabrication tools 122 that may be used to form metal-insulator-metal capacitors such as capacitor 8 on an integrated circuit. As shown in FIG. 13, fabrication tools 122 may include depositing tools 124, polishing tools 126, and photolithography tools 128. If desired, fabrication tools 122 may include other tools desirable for fabricating integrated circuits (e.g., tools suitable for performing the steps of flowchart 100 of FIG. 12).

Depositing tools 124 may include tools for performing atomic layer deposition (ALD), molecular beam epitaxy (MBE), electrochemical deposition (ECD), chemical vapor deposition (CVD), physical vapor deposition (PVD), etc. Depositing tools 124 may, for example, be used to deposit conductive layers, dielectric layers, etch stop layers, or other materials on the integrated circuit. Polishing tools 126 may include tools for performing chemical-mechanical planarization (CMP) polishing or other polishing techniques. Photolithography tools 128 may be used to apply photoresist masks to the integrated circuit. Photolithography tools 128 may include etching tools 130 for selectively removing portions of the integrated circuit based on the applied photoresist masks. Etching tools 130 may, for example, include wet etching tools or dry etching tools. Etching tools 128 may be used to remove photoresist material, conductive layers, dielectric layers, or other materials from the integrated circuit.

Figure 14:
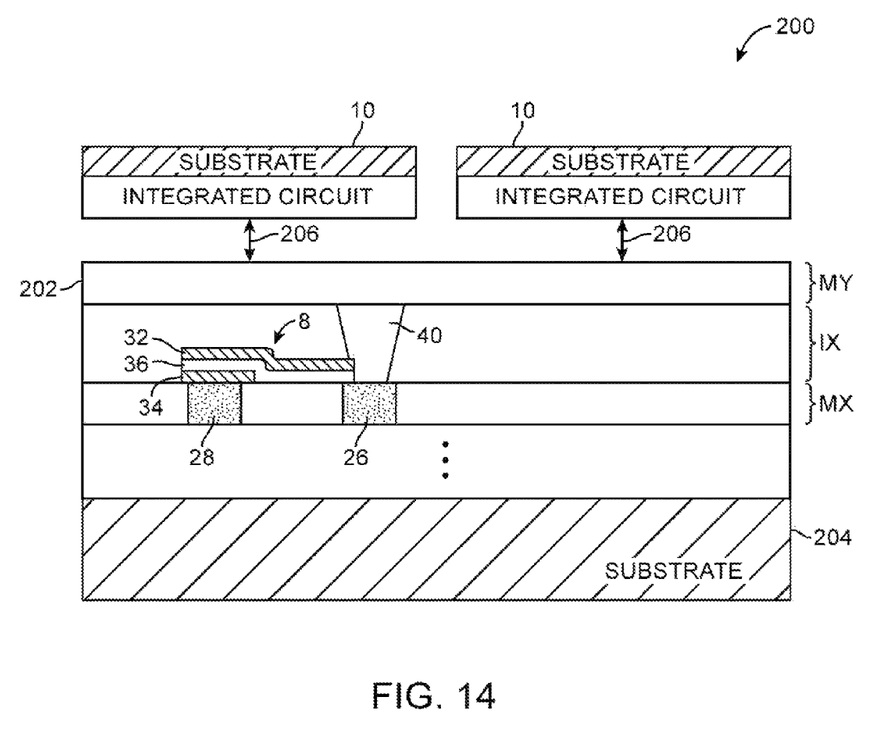
FIG. 14 is a diagram of an interposer formed with a metal-insulator-metal capacitor in accordance with an embodiment of the present invention.

As another suitable embodiment, metal-insulator-metal capacitors may be formed on an integrated circuit that is used to route signals between two or more different integrated circuits. The given integrated circuit that is used to route signals between two different integrated circuits may sometimes be referred to as an interposer, because the given integrated circuit may be interposed between the two different integrated circuits. FIG. 14 is an illustrative device 200 in which an interposer 202 is coupled to two integrated circuits 10 (e.g., each integrated circuit 10 may be formed substantially similar to integrated circuit 10 of FIG. 1). Each integrated circuit 10 may be formed on respective substrates. Interposer 202 may be formed on substrate 204.

As shown in FIG. 14, interposer 202 may include metal layers MX and MY and inter-metal dielectric layer IX interposed between metal layers MX and MY. Interposer 202 may be coupled to each integrated circuit 10 via respective coupling paths 206. As an example, coupling paths 206 may be formed of solder (e.g., solder balls) or other conductive materials such as copper (e.g., copper microbumps may be formed to contact integrated circuits 10 with interposer 202). Coupling paths 206 may be coupled to metal layer MY.

Metal layers such as MY and MX may be used to route signals between integrated circuits 10. The signals may be routed through one or more metal layers. For example, a first signal may be routed directly between integrated circuits 10 through metal layer MY, whereas a second signal may be routed from a first integrated circuit 10 through metal layer MY and via 40 to a second metal layer MX. In this scenario, the second signal may be routed through metal-insulator-metal capacitor 8 to path 28 before being routed to a second integrated circuit 10. Metal-insulator-metal capacitors 8 may be used to form any desired circuit configuration within interposer 202. For example, metal-insulator-metal capacitors 8 may be used to form filters such as high-pass or low-pass filters, may be used to form decoupling capacitors, or other desired circuitry. If desired, each signal may be routed through any suitable number of metal layers (e.g., so that available area of metal layers is efficiently utilized when forming capacitors 8).

The example of FIG. 14 in which metal-insulator-metal capacitor 8 is formed on metal layer MX is merely illustrative. If desired, metal-insulator-metal capacitor 8 may be formed on any desired metal layer of interposer 202. Multiple metal-insulator-metal capacitors 8 may be formed between any two desired conductive paths of a selected metal layer (e.g., to provide a series capacitance between the two conductive paths).

Figure 15:
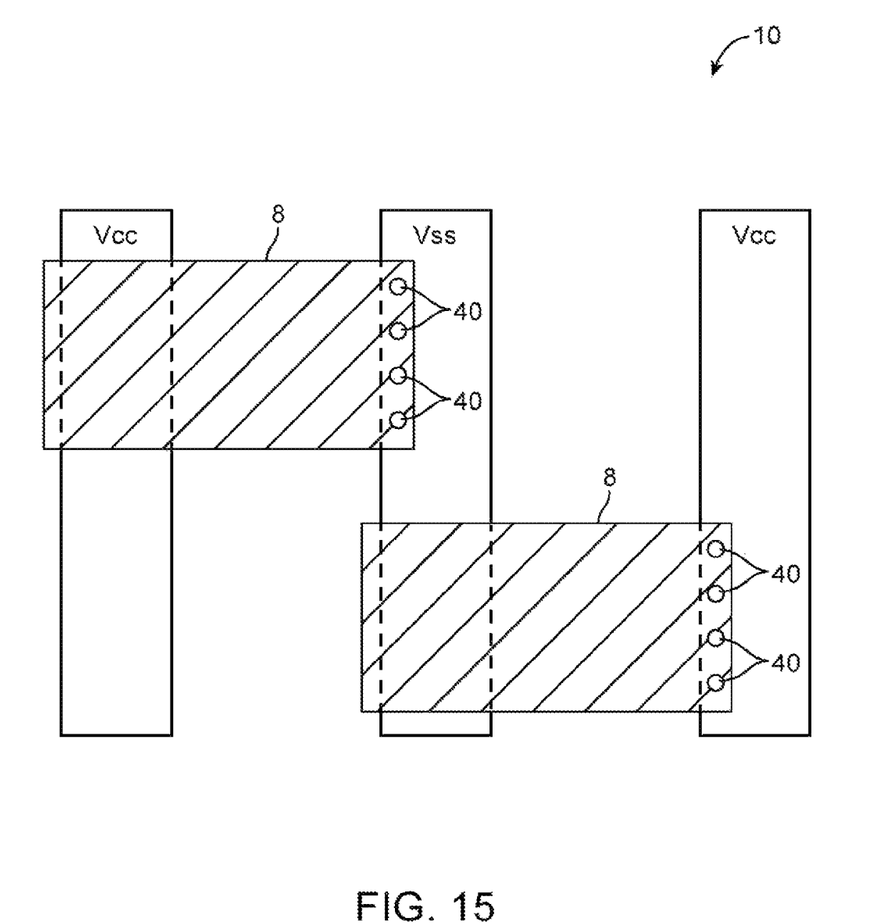
FIG. 15 is a top-down view of illustrative metal-insulator-metal capacitors formed as decoupling capacitors in accordance with an embodiment of the present invention.

Metal-insulator-metal capacitor 8 may be used to form decoupling capacitors between power supply lines of an existing integrated circuit layout. FIG. 15 is a top-down view of metal-insulator-metal capacitors 8 formed as decoupling capacitors. As shown in FIG. 15, device 10 may include power supply lines VCC and VSS that are used to supply power to circuitry on device 10 (e.g., power supply lines formed in a given metal interconnect layer). Metal-insulator-metal capacitor 8 may be formed to overlap power supply lines VCC and VSS. Vias 40 may be formed for each capacitor 8 to simultaneously contact a first power supply line and capacitor 8 (e.g., a top capacitor electrode of capacitor 8), whereas each capacitor 8 may contact a second power supply line (e.g., a bottom capacitor electrode may contact the second power supply line).

The foregoing is merely illustrative of the principles of this invention and various modifications can be made by those skilled in the art without departing from the scope and spirit of the invention. The foregoing embodiments may be implemented individually or in any combination.

What is claimed is:

1. A metal-insulator-metal capacitor formed in an integrated circuit die having interconnects formed from alternating metal interconnect layers and inter-metal dielectric layers, wherein the metal interconnect layers include conductive interconnect lines and wherein the inter-metal dielectric layers include conductive vias, the metal-insulator-metal capacitor comprising:
    a first capacitor electrode in a given one of the inter-metal dielectric layers that contacts one of the conductive interconnect lines in an underlying one of the metal interconnect layers; and
    a second capacitor electrode in the given inter-metal dielectric layer that completely overlaps and extends past the first capacitor electrode as viewed from above, wherein the first and second capacitor electrodes are formed in the integrated circuit die, and wherein a selected one of the conductive vias contacts a portion of the second capacitor electrode extending past the first capacitor electrode.

2. The metal-insulator-metal capacitor of claim 1, wherein the selected conductive via extends between the underlying metal interconnect layer and an additional metal interconnect layer in the metal interconnect layers.

3. The metal-insulator-metal capacitor of claim 1 further comprising a capacitor dielectric layer between the first and second capacitor electrodes.

4. The metal-insulator-metal capacitor of claim 3 wherein the capacitor dielectric layer comprises silicon dioxide.

5. The metal-insulator-metal capacitor of claim 3 wherein the capacitor dielectric layer comprises a high-κ dielectric material.

6. The metal-insulator-metal capacitor of claim 5 wherein the high-κ dielectric material comprises chromium oxide.

7. The metal-insulator-metal capacitor of claim 2 wherein the one of the conductive interconnect lines in the underlying metal interconnect layer comprises a positive power supply line, wherein an additional one of the conductive interconnect lines in the underlying metal interconnect layer comprises a power supply ground line, and wherein the metal-insulator-metal capacitor forms a decoupling capacitor between the positive power supply line and the power supply ground line.

8. The metal-insulator-metal capacitor of claim 1 wherein the first and second capacitor electrodes are formed from tantalum nitride.

9. A metal-insulator-metal capacitor formed in an integrated circuit die, comprising:
    a first metal interconnect layer;
    a first capacitor electrode formed directly on the first metal interconnect layer;
    a second capacitor electrode formed over the first capacitor electrode;
    a second metal interconnect layer formed above the second capacitor electrode; and
    a via that directly contacts the second capacitor electrode and the first metal interconnect layer.

10. The metal-insulator-metal capacitor defined in claim 9 further comprising a capacitor dielectric layer between the first and second capacitor electrodes.

11. The metal-insulator-metal capacitor defined in claim 9 wherein the first capacitor electrode electrically contacts the first metal interconnect layer.

12. The metal-insulator-metal capacitor defined in claim 9 wherein the first capacitor electrode contacts a positive power supply line formed in the first metal interconnect layer and wherein the second capacitor electrode contacts a power supply ground line formed in the first metal interconnect layer.

13. The metal-insulator-metal capacitor defined in claim 9 wherein the integrated circuit comprises an interposer integrated circuit operable to route signals between first and second integrated circuits each having respective substrates.

14. The metal-insulator-metal capacitor defined in claim 9 wherein the via has a first end that contacts the first metal interconnect layer and a second end that contacts the second metal interconnect layer.

15. An integrated circuit die, comprising:
   a substrate;
   a first metal interconnect layer on the substrate in the integrated circuit die;
   a second metal interconnect layer that is formed over the first metal interconnect layer in the integrated circuit die;
   a dielectric layer interposed between the first and second metal interconnect layers;
   a first capacitor electrode that is formed directly on the first metal interconnect layer without an intervening via structure;
   a second capacitor electrode within the dielectric layer that is electrically connected to the first and second metal interconnect layers;
   a via having a first end that contacts the first metal interconnect layer and a second end that contacts the second metal interconnect layer; and
   an interconnect in the second metal interconnect layer that contacts the via and is electrically connected by the via to the second capacitor electrode.

16. The integrated circuit defined in claim 15, wherein the first metal interconnect layer comprises a plurality of interconnects and wherein the first capacitor electrode contacts a given interconnect of the plurality of interconnects.

17. The integrated circuit defined in claim 15 further comprising:
   a first interconnect in the first metal interconnect layer that contacts the first capacitor electrode; and
   a second interconnect in the first metal interconnect layer that contacts the via and is electrically connected by the via to the second capacitor electrode.

18. The integrated circuit defined in claim 15 wherein the integrated circuit comprises an interposer integrated circuit on which first and second integrated circuits are mounted and wherein the interposer integrated circuit conveys signals between first and second integrated circuits.

\* \* \* \* \*